United States Patent [19]
Sterling, Jr. et al.
[11] Patent Number: 4,816,703
[45] Date of Patent: Mar. 28, 1989

[54] ON-LINE SERIAL COMMUNICATION INTERFACE FROM A CURRENT LOOP TO A COMPUTER AND/OR TERMINAL

[75] Inventors: Edward L. Sterling, Jr., Cleveland; William L. Thompson, Montville, both of Ohio

[73] Assignee: The Babcock & Wilcox Company, New Orleans, La.

[21] Appl. No.: 764,914

[22] Filed: Aug. 12, 1985

[51] Int. Cl.[4] ...................... H03K 19/92; H03K 17/16

[52] U.S. Cl. ................................ 307/475; 340/310 R; 375/36

[58] Field of Search ......................... 307/475, 260, 443

[56] References Cited

U.S. PATENT DOCUMENTS

| | | | |
|---|---|---|---|
| 4,166,963 | 9/1979 | Metcalf | 307/260 |
| 4,623,799 | 11/1986 | Nyman, Jr. | 307/260 |
| 4,691,328 | 9/1987 | Sterling, Jr. et al. | 375/36 |
| 4,729,125 | 3/1988 | Sterling, Jr. et al. | 375/36 |

OTHER PUBLICATIONS

"IC Schematic Source Master", John Wiley & Sons, 1978, p. 342, Precision Process Control Interface.

"Understanding Data Communications", by G. E. Friend et al., 1984, Texas Instruments, pp. 4–25 to 4–26.

"Byte", p. 330, AD inquiry 26, McGraw Hill.

*Primary Examiner*—Stanley D. Miller
*Assistant Examiner*—Richard Roseen
*Attorney, Agent, or Firm*—Vytas R. Matas; Robert J. Edwards

[57] ABSTRACT

An on-line serial communication interface is established from the transmitter of a two line current loop transmitter to a digital circuit such as a computer or hand-held terminal which receives and processes digital voltage pulses. The interface includes a comparator having a positive terminal connected by a capacitor to one of the current lines, and a negative terminal connected to a source of small positive voltage. The output of the comparator is connected to an input port of the digital device. The transmitter modulates the current on the current loop by a small amount with respect to the analog current communicated by the transmitter. This generates voltage pulses in the capacitor which are compared to the selected voltage and are amplified to form large pulses used for communication with the computer or hand-held terminal.

4 Claims, 1 Drawing Sheet

ON-LINE SERIAL COMMUNICATION INTERFACE FROM A CURRENT LOOP TO A COMPUTER AND/OR TERMINAL

FIELD AND BACKGROUND OF THE INVENTION

The present invention relates in general to digital interface equipment, and in particular to a new and useful on-line serial communication interface from a transmitter of a current loop to a computer or hand-held terminal.

Two-wire analog transmission systems are well known. Such systems include a transmitter which is connected to a power supply by two wires which from a current loop. The transmitter includes, as at least one of its features, a transducer which senses a condition such as pressure or temperature. This condition is known as a process variable (PV).

A power supply is connected to the two wires to close the current loop. It is also conventional to provide a resistor in the current loop. The transmitter amplifies the signal from its transducer and this amplified signal is used to draw a certain current from the power supply which is proportional or otherwise related to the process variable. It is conventional to draw from a minimum of 4 mA to a maximum of 20 mA. The current between 4 and 20 mA passes through the resistor to produce a voltage drop across the resistor. This voltage drop can be measured to give a value for the process variable.

It is noted that the 4 mA minimum current is required to energize the circuitry of the transmitter. Any excess current above this 4 mA level is taken as a value which can be used to determine the process variable.

It is known that such 4–20 mA two-wire systems have an accuracy which is limited to around 0.1% at best. These systems are also essentially unidirectional with the transmitter being essentially uncontrolled and transmitting continuously.

The transmitters in such circuits are generally limited in accuracy to about 0.1% and their functionality is limited to only continuous reading and sensing of the process variable.

SUMMARY OF THE INVENTION

The present invention utilizes microprocessor technology to improve the overall accuracy and expand the functionality of transmitter devices.

The present invention provides an apparatus for interfacing a computer or hand-held terminal with a current loop for communication from a two-wire analog current loop transmitter which the transmitter is still on-line (sending analog information) to a controller or some other monitoring device.

Accordingly an object of the present invention is to provide an on-line serial communication interface for a digital circuit such as a computer or hand-held terminal, which digital circuit receives voltages pulses, representing distinct values of the process variable from a current loop having lines for connecting a transmitter to a power supply for drawing current from the power supply according to a process variable sensed by the transmitter and for modulating the current on the current loop, comprising a resistor connected in series in one of the lines of the current loop for establishing a voltage drop on the one line which depends on current drawn by the transmitter, a capacitor connected to the one line for receiving the voltage drop on the one line, the voltage drop being modulated into voltage pulses when the transmitter modulates the current on the one line, and a comparator having an output connected to the digital circuit, and having two inputs, one of the inputs being connected to the capacitor for receiving the voltage pulses and the outer input being connected to a selected constant voltage whereby the comparator outputs voltage pulses which are applied to the digital circuit.

A further object of the invention is to provide a serial communication interface between a current loop and a digital circuit which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
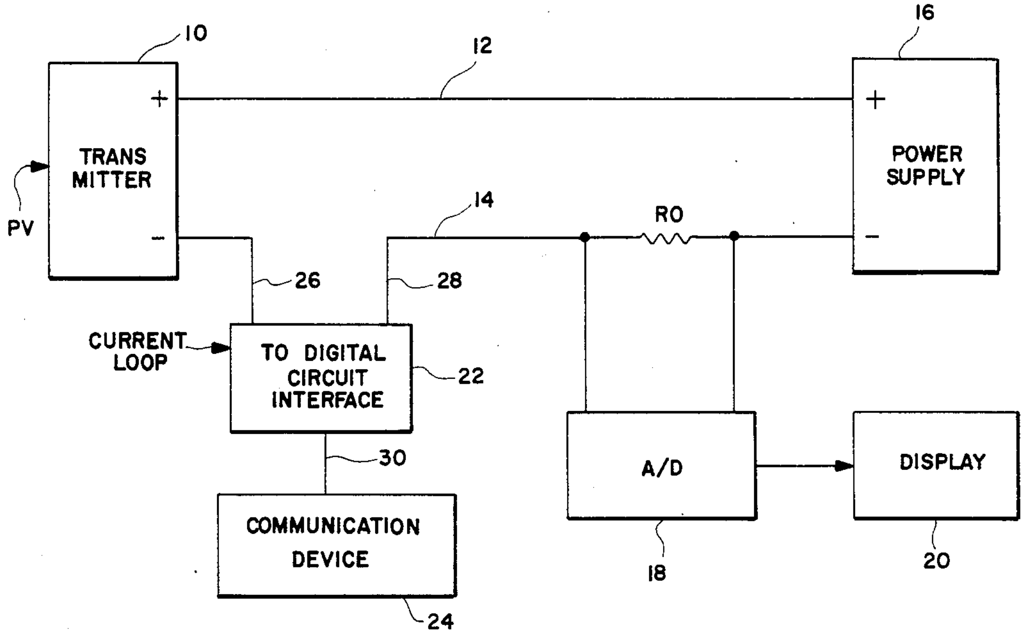
FIG. 1 is a block diagram showing a conventional current loop having a communication device such as a computer or hand-held terminal connected to the current loop.

Referring to the drawings in particular, the present invention provides an on-line serial communication interface 22 between a digital circuit shown as communication device 24 in FIG. 1, such as; and IBM PC, Radio Shack Model 100 or, Termiflex hand held Terminal, and a current loop formed by Bailey's Smart transmitter 10, lines 12,14 and any 12–48 DC volt power supply 16. As is known, one of the lines 14 may include a resistor RO, which has a voltage drop thereacross proportional to a current flowing in the lines 12,14. Transmitter 10 may include a transducer such as a pressure or temperature transducer (not shown) which receives a process variable PV. The transducer may be connected to a microprocessor in transmitter 10 which controls the amount of the current to be drawn from power supply 16 on lines 12 and 14.

The voltage drop across resistor RO is measure by an analog-to-digital convertor 18. This voltage drop can be displayed on a display unit 20 as a measurement of the process variable PV.

A Serial Interface 22 is connected to current loop line 14 by connecting lines 26 and 28. Communicating device 24 is connected to the serial interface 22 through line 30. Communicating device 24 is a digital circuit such as a computer, microprocessor, or hand-held terminal. Device 24 receives digital information in the form of voltage pulses on line 30 for establishing digital communication with the current loop. Device 24 includes an RS-232C device which receives and/or sends a digital signal one bit at a time. A logic high is between +3 and +12 volts, a logic low is between −3 and −12 volts.

Figure 2:
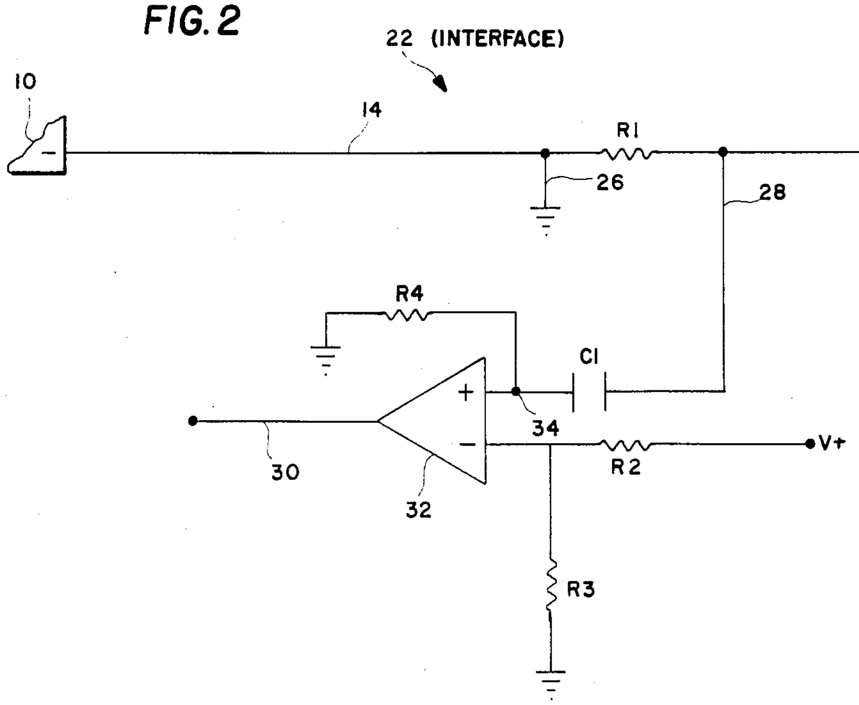
FIG. 2 is a schematic diagram of the inventive on-line serial communication interface between the communication device and the current loop.

FIG. 2 illustrates the on-line serial communication interface of the present invention.

According to the invention, when the microprocessor or other circuitry of the transmitter is to communicate with the communicating device shown at 24 in FIG. 1, the transmitter pulses the current on line 14. Depending on the value of resistor R1, the current pulses produce corresponding voltage pulses which appear at a line 28 connected to line 14.

A capacitor C1 is connected to line 28 for receiving the voltage pulses and transmitting them to the positive terminal of a comparator or differential amplifier 32. The output of amplifier 32 is connected to the communicating device 24, for example over line 30. As noted above the communicating device is in the form of a computer or hand-held terminal and is structured to receive and process large voltage pulses for RS-232C communication.

The negative terminal of comparator 32 is held slightly positive by a resistor divider circuit made up of resistors R2 and R3. This divider circuit is connected to a source of constant voltage V+. This keeps any noise across resistor R1 from tripping the comparator 32. It also holds the output of the comparator at line 30, at ground potential which is necessary for idle operation of RS-232C device 24. The comparator converts the 80 mV pulses into large voltage pulses needed for communication with the digital circuit 24.

Point 34 is also connected to ground over resistor R4 for the proper functioning of comparator 32.

A major advantage of the present invention is that communication can be achieved while the transmitter is still on-line with a controller. This is possible because there is little effect on the current in the loop. Communication is down by modulating the current in the loop by a small amount. That is the current modulation is small with respect to the 4–20 mA current needed for analog communication from the transmitter 10.

Another advantage is that the interface is powered by using the requestto-send line from the RS-232C port of the operator's communicating device 24. No extra power supply is necessary.

Applicant's copending application, now U.S. Pat. No. 4,691,328 discloses an On-Line Serial Communication Interface From a Computer to a Current Loop.

While a specific embodiment of the invention has been shown and described in detail to illustrate the application of the principles of the invention, it will be understood that the invention may be embodied otherwise without departing from such principles.

What is claimed is:

1. An on-line serial communication interface for communication between a transmitter of an analog current loop and a digital circuit, requiring amplified pulses to operate the transmitter being connected by the current loop to a power supply to drain current from the power supply according to the value of a process variable sensed by the transmitter and the transmitter begin capable of modulating the current on the current loop in proportion to the process variable which varies in accordance with the current from the transmitter;

a capacitor connected to the current loop for receiving the pulses; and a comparator having an output and two inputs, one of said inputs being connected to said capacitor and the other of said inputs being connected to a selected small voltage, said comparator amplified pulses on its output which are synchronized with the voltage pulses in the current loop, said output of said comparator being connected to the digital circuit for applying the amplified pulses to the digital circuit.

2. An interface according to claim 1, wherein the digital circuit includes a computer provided with an RD-232C, receiving and transmitting signals one bit at a time.

3. An interface according to claim 1, wherein said comparator comprises a differential amplifier for amplifying the voltage pulses established by said resistor to produce amplified voltage pulses.

4. An interface according to claim 1, including a voltage divider connected between said voltage source and said other input of said comparator.

* * * * *

UNITED STATES PATENT AND TRADEMARK OFFICE
CERTIFICATE OF CORRECTION

PATENT NO. : 4,816,703

DATED : March 28, 1989

INVENTOR(S) : Edward L. Sterling, Jr., et al

It is certified that error appears in the above-identified patent and that said Letters Patent is hereby corrected as shown below:

At Column 4, line 10, claim 1 should be rewritten as follows:

1. An on-line serial communication interface for communication between a transmitter of an analog current loop and a digital circuit requiring amplified pulses to operate, the transmitter being connected by the current loop to a power supply to drain current from the power supply according to the value of a process variable sensed by the transmitter and the transmitter being capable of modulating the current on the current loop in proportion to the process variable, comprising:

a resistor serially connected in said current loop for establishing voltage pulses which vary in accordance with the current from the transmitter;

a capacitor connected to the current loop for receiving the pulses; and a comparator having an output and two inputs, one of said inputs being connected to said capacitor and the other of said inputs being connected to a selected small voltage, said comparator generating amplified pulses on its output which are synchronized with the voltage pulses in the current loop, said output of said comparator being connected to the digital circuit for applying the amplified pulses to the digital circuit.

At Column 4, line 33, in claim 2, "RD-232C," should be --RS-232C,--.

Signed and Sealed this

Thirteenth Day of February, 1990

*Attest:*

JEFFREY M. SAMUELS

*Attesting Officer* *Acting Commissioner of Patents and Trademarks*